United States Patent [19]

Faris

[11] Patent Number: 4,814,598

[45] Date of Patent: Mar. 21, 1989

[54] OPTICAL WAVELENGTH ANALYZER AND IMAGE PROCESSING SYSTEM UTILIZING JOSEPHSON JUNCTIONS

[75] Inventor: Sadeg M. Faris, Pleasantville, N.Y.

[73] Assignee: Hypres, Inc., Elmsford, N.Y.

[21] Appl. No.: 92,513

[22] Filed: Sep. 3, 1987

[51] Int. Cl.$^4$ .............................................. H01J 40/14
[52] U.S. Cl. .................................. 250/211 J; 357/5
[58] Field of Search ................. 357/5, 6; 250/211 R, 250/211 J, 208, 209, 226; 307/306, 476, 352

[56] References Cited

U.S. PATENT DOCUMENTS

| | | | |
|---|---|---|---|
| 4,117,503 | 9/1978 | Zappe | 307/306 |
| 4,245,169 | 1/1981 | Hamilton | 307/352 |
| 4,334,158 | 6/1982 | Faris | 357/6 |
| 4,401,900 | 8/1983 | Faris | 307/306 |
| 4,521,682 | 6/1985 | Murakami et al. | 250/211 J |
| 4,533,840 | 8/1985 | Gheewala et al. | 357/5 |
| 4,638,185 | 1/1987 | Kobayashi et al. | 307/352 |

OTHER PUBLICATIONS

"Analog Measurement Applications for High Speed Josephson Switches" Hamilton et al., IEEE Transactions on Magnetics, vol. MAG-17, No. 1, Jan. 1981.

"Picosecond Sampling with Josephson Junctions" Peter Wolf, Picosecond Electronics and Optoelectronics, edited by Mourou et al., Springer Vertag IBM Journal of Research and Development, vol. 24, No. 2/Mar. 1980.

Sampling Techniques Primer TEK 7000 Series Modular Oscilloscopes, Technique Primer 42W-5969 ©1985.

"Observation of Grain Boundary Josephson Current in BaPb$_{0.7}$Bi$_{0.3}$O$_3$ Films" Enomoto et al., Japanese Journal of Applied Physics, vol. 20, No. 9, Sep. 1981, pp. L661-L664.

"Transient Responses of Superconducting Lead Films Measured with Picosecond Laser Pulses", C. C. Chi et al., Physical Review B, vol. 23, No. 1, Jan. 1, 1981.

"Highly Sensitive Optical Detector Using Superconducting Oxide BaPb$_{0.7}$Bi$_{0.3}$", Enomoto et al., Japanese Journal of Applied Physics, vol. 2M, No. 5, May 1, 1984, pp. L333-L335.

TEK Products 1987, Tektronix.

"Effect and Applications of Pattern Laser Illumination on Superconducting Films", C. C. Chi et al., Physical Review B, vol. 29, No. 9, May 1, 1984, pp. 4908-4913.

"Transient Response of Superconducting Pb Microbridges Irradiated by Picosecond Laser Pulses and its Potential Applications" C. C. Chi et al., IEEE Transactions on Magnetics, vol. MAG-17, No. 1, Jan. 1981.

"Non-Equilibrium Phenomena in Superconductivity", D. N. Langenberg, Proceedings of the 14th International Conference on Law Temp. Physics, vol. 5, 1975.

Primary Examiner—David C. Nelms
Attorney, Agent, or Firm—Kenyon & Kenyon

[57] ABSTRACT

An apparatus for measuring the intensity of incident optical radiation utilizes the properties of superconductivity films. The apparatus may include at least one Josephson junction having the optical radiation incident thereupon, an electronic circuit coupled to receive a signal from the Josephson junction proportional to the incident radiation. The Josephson junction has a time-current switching threshold current selected to switch the function 50% of the time. A feedback loop from the electronic circuit maintains the function operation. One or more junctions may be used to monitor radiation of different wavelengths or to produce optical images.

16 Claims, 7 Drawing Sheets

OPTICAL WAVELENGTH ANALYZER AND IMAGE PROCESSING SYSTEM UTILIZING JOSEPHSON JUNCTIONS

BACKGROUND OF THE INVENTION

The present invention relates to an optical wavelength analyzer and optical imaging system, and in particular, to such a system wherein the properties of superconducting films are utilized in the production of optical energy sensitive components.

It is known that superconducting films may be sensitive to optical radiation. See, for example, the following articles relating to the optical sensitivity of superconducting films:

(1) Transient Responses of Superconducting Lead Films measured with Picosecond Laser Pulses, by Chi et al, Physical Review B, Vol. 23, No. 1, January 1981, The American Physical Society;

(2) Highly Sensitive Optical Detector Using Superconducting Oxide BaPb0.7 Bi0.3 03 (BPB), by Enomoto et al, Japanese Journal of Applied Physics, Vol. 2M No. 5, May 1984, pp. L333–L335;

(3) Effect and Applications of Patterned Laser Illumination on Superconducting Films, by Chi et al, Physical Review B, Vol. 29, No. 9, May 1984, The American Physical Society;

(4) Transient Response of Superconducting Pb Microbridges Irradiated by Picosecond Laser Pulses and its Potential Applications, by Chi et al, IEEE Transactions on Magnetics, Vol. MAG-17, No. 1, January 1981;

(5) Nonequilibrium Phenomena in Superconductivity, Proceedings of the 14th International Conference on Low Temperature Physics, Vol. 5, 1975, pp. 223–263, by D. N. Langenberg.

The article by Enomoto et al. suggests that Josephson junctions may be responsive to optical radiation, but there is no suggestion in this reference that Josephson junctions may be sensitive to a broad range of optical energy. The January 1981 article by Chi et al. studies the transient responses of superconducting lead films and indicates that such lead films are responsive to incident optical radiation.

None of these references, however, suggest that Josephson junctions can be utilized as optically sensitive elements of an optical detection system, nor do any of the references suggest how signals from Josephson junctions can be processed to take advantage of their sensitivity to optical radiation.

SUMMARY OF THE INVENTION

It is an object of the present invention to provide an optical wavelength analyzer which utilizes properties of superconducting films to detect light.

It is a further object of the present invention to provide an optical wavelength analyzer which utilizes a Josephson juncton of superconducting films as the optical detection element.

It is furthermore an object of the present invention to provide an optical wavelength analyzer which is extremely responsive to small intensities of incident optical radiation.

It is yet a further object of the present invention to provide an optical wavelength analyzer which is linear over a wide range of wavelengths.

It is yet another object of the present invention to provide an optical image processing system which utilizes Josephson junctions as the optically sensitive elements.

It is still yet a further object of the present invention to provide an optical image processing system which is linear over a wider range of wavelengths including gamma rays and responsive to small intensities of optical radiation.

The above and other objects of the present invention are achieved by an apparatus for measuring the intensity of incident optical radiation comprising Josephson junction means having the optical radiation incident upon a junction thereof, the Josephson junction means being operable in a first state wherein a voltage across the junction is substantially zero and a second state wherein said voltage across said junction is substantially non-zero and being responsive to a bias current to enable said Josephson junction means to switch between said first and said second states with a predetermined frequency, and electronic circuit means coupled to receive a signal from the Josephson junction means and for supplying a control signal to said Josephson junction means to maintain the switching of said Josephson junction means between said just and said second states at said predetermined frequency, said control signal being proportional to the intensity of the incident optical radiation.

BRIEF DESCRIPTION OF THE DRAWINGS

The invention will be described in greater detail in the following detailed description with reference to the drawings in which.

DETAILED DESCRIPTION

Figure 1:
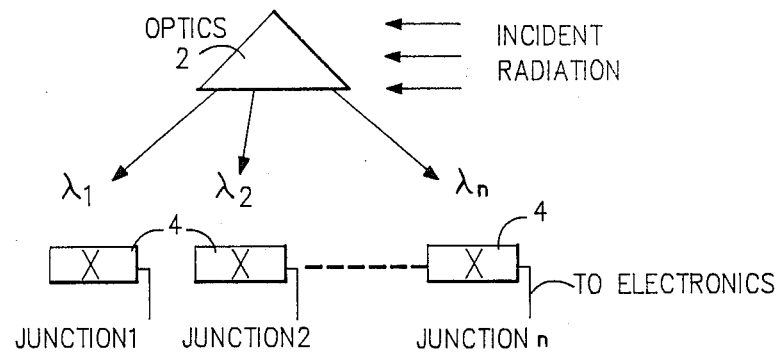
FIG. 1 is a schematic illustration of an optical wavelength analyzer which utilizes a plurality of Josephson junctions in a parallel processing system.
Figure 2:
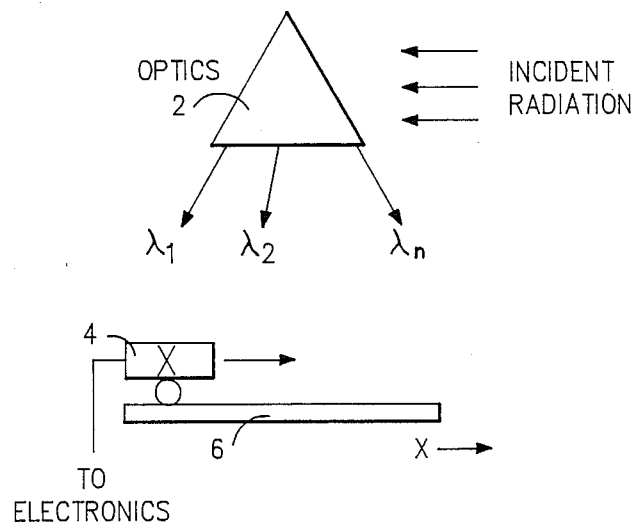
FIG. 2 is a schematic illustration of one embodiment of an optical wavelength analyzer using a single Josephson junction in a serial processing system.

With reference now to the drawings, FIGS. 1 and 2 illustrate two techniques for applying Josephson junctions to an optical wavelength analyzer. In FIG. 1, parallel processing is utilized, while in FIG. 2, serial processing of the incident optical radiation is utilized.

In the system shown in FIG. 1, a linear array of Josephson junctions 4 is arranged in such a manner that each junction is excited by radiation of a different wavelength. This may be performed by a suitable optical device 2, such as a prism, which separates the incident radiation into a plurality of wavelengths $\lambda 1, \lambda 2, \ldots \lambda n$. Accordingly, each Josephson junction 4 is responsive only to a single wavelength because only optical energy of that particular wavelength is incident on the junction. The broadband incident radiation can be spread into spatially separated wavelengths via dispersive prisms, gratings, or other optical means. If the wavelength irradiating each element of the array is known, then it is possible to map out the intensity of that particular wavelength. Furthermore, it is possible to map out the intensity of the incident radiation as a function of wavelength by suitably processing the signals from each of the junctions 4. This assumes that the first element of the array receives one known wavelength which then either increases or decreases across the remainder of the array.

FIG. 2 shows an optical wavelength analyzer utilizing serial processing. In the system shown in FIG. 2, the Josephson juncton 4 may be moved along a track 6 by a suitable drive means, such as an electrical stepper motor. The Josephson junction 4 is positioned at an appropriate point along track 6 so that it detects optical radiation corresponding to that particular wavelength. Alternatively, the optical device 2 can be moved and the junction held stationary. As in the device of FIG. 1, the output of the junction 4 can be used to provide a measure of the intensity of the radiation as a function of wavelength.

Figure 3:
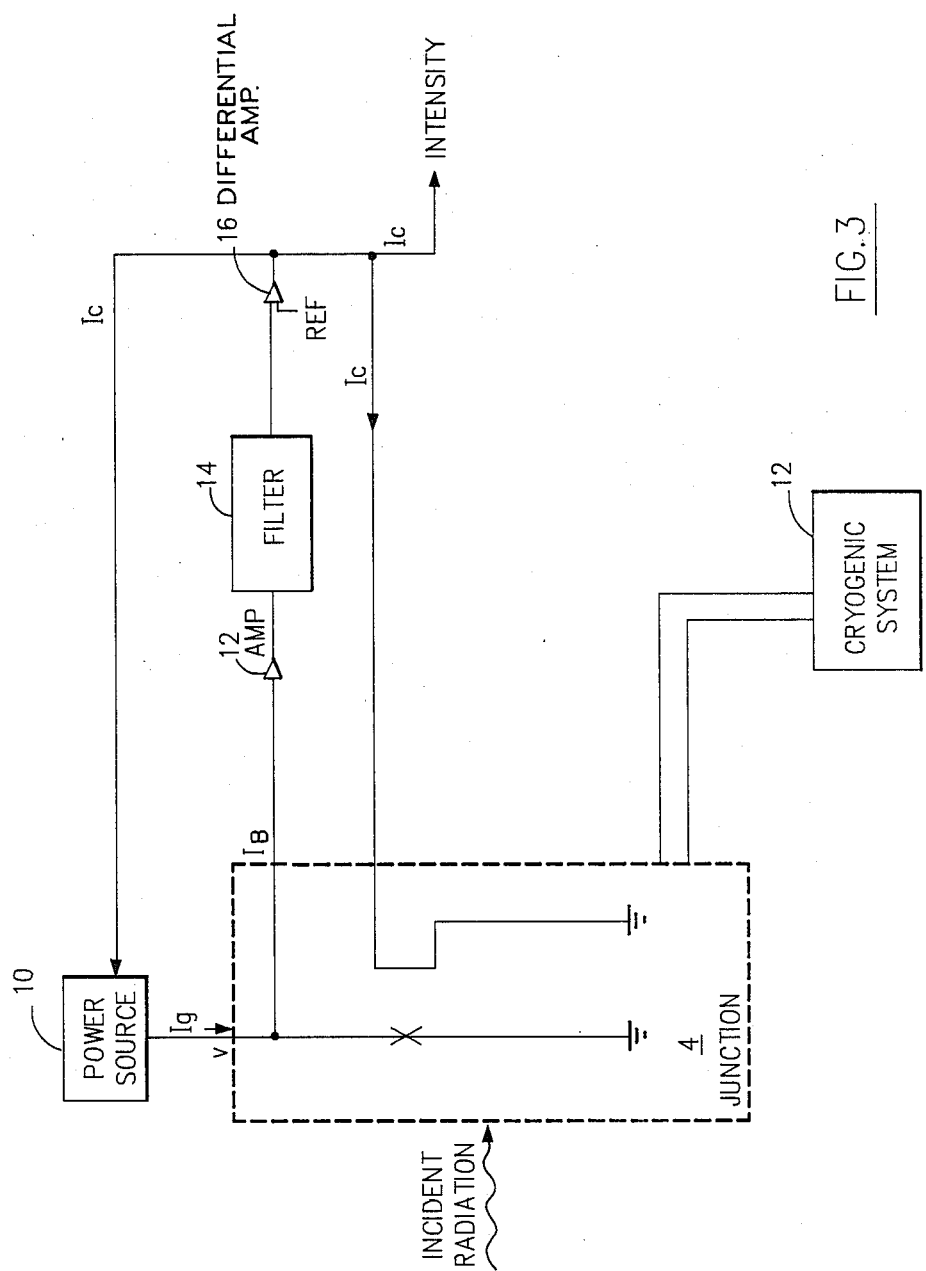
FIG. 3 is a diagram for a circuit for measuring the optical intensity of the radiation incident on a Josephson junction.

FIG. 3 is a circuit diagram showing how the amplitude of the optical field radiation may be tracked via a feedback current that controls a Josephson junction. The Josephson junction 4 is illuminated by incident radiation as shown. A bias current $I_g$ is supplied from clock/power source 10, and suitable cryogenic means 12 for maintaining the Josephson junction at low temperature is also provided. Current Ig may be sinusoidal, square, rectangular or have other similar waveshapes symmetrical about a horizontal axis. A signal $I_B$ from the Josephson junction is supplied to an amplifier 12 coupled to a low pass filter 14. The output of the low pass filter 14 is supplied to a first input of a comparator or differential amplifier 16. The switching threshold of the Josephson junction is fixed such that its junction switches with a predetermined frequency, for example, 50% of the time. An aspect of this invention is recognizing that feedback control current can be made to be linearly related to optical intensity. In the present invention, the reference voltage, supplied to a second input of differential amplifier 16, is adjusted so that the output of the differential amplifier 16 is zero when the Josephson junction switches 50% of the time. If the output of the differential amplifier 16 deviates from zero, a current Ic, a feedback control signal, is fed back to the junction to ensure locking of the comparator output at zero. Thus, feedback control signal Ic tracks variations in the optical field amplitude. This aspect is illustrated more fully below.

Synchronous detection of junction signal $I_B$ can be used to achieve very wide dynamic range and high sensitivity. A number of room temperature electronic circuits each comprising amplifier 12, filter 14 and and differential amplifier 16 are required to supply each Josephson junction with a respective control signal. The number of room temperature electronic circuits is equal to the number of Josephson junctions in the array unless suitable multiplexing techniques are used which can reduce the number of room temperature circuits required. If the serial system of FIG. 2 is utilized, only one such room temperature circuit is required. If the parallel system of FIG. 1 is utilized, a number of such circuits are required for the elements in the array.

Figure 4:
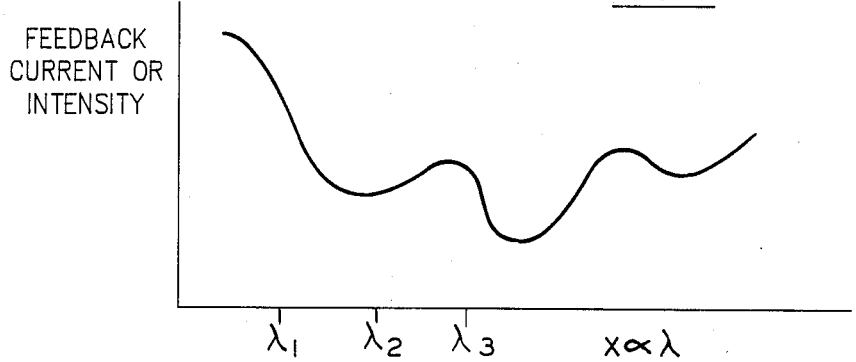
FIG. 4 is a graph illustrating the relationship of the feedback current of the circuit of FIG. 3 to the wavelength of the incident optical energy.

As explained, the serial system shown in FIG. 2 requires only a single junction and one electronic processing circuit. As shown in FIG. 2, the junction can be translated so that it intercepts radiation of different wavelengths. Alternatively, the optical device 2 can be moved across a stationary junction. If the Josephson junction itself is moved, a suitable drive mechanism driving a translation stage within a cryogenic environment would be required. The mapping of optional field amplitude for each wavelength is then determined by knowing the junction position and the feedback current. For each fixed position, the processing electronics send a feedback current replicating the variations in optical field amplitude. As shown in FIG. 4, variations in optical field amplitude or the feedback current $I_c$ can be tracked as a function of wavelength or position of the Josephson junction at any instant in time.

The Josephson Effect Mode of Operation

The physics of nonequilibrium superconductivity and Josephson junctions are combined in the invention to demonstrate the concept of controlling the Josephson current, also referred to as the critical current or switching threshold, which can be suppressed linearly either by an electrical current or by an optical field. Thus, the electrical current can be related to an optical field which irradiates the junction causing it to switch. The Josephson junction responds to applied signals by switching from its $V=0$ state to its $V \neq 0$ state upon exceeding a threshold current $I_{th}$ given by $$I_{th} = \frac{\pi}{2e} \frac{\Delta o}{R_{nn}} \frac{\Delta}{\Delta o} f(I_c)$$

$$I_{th}/I_o = \frac{\Delta}{\Delta o} f(I_c)$$

where $$I_o = \frac{\Delta o}{2eR_{nn}}$$

and $I_{th}$ is also known as the Josephson current is the superconducting gap in the absence of pair breaking perturbations; $R_{nn}$ is the normal tunneling resistance; $f(I_c)$ is a function of the applied control current $I_c$. Usually a junction is biased in the $V=0$ state with a current $I_g$, and then upon application of a control current the threshold is exceeded causing it to switch to the $V \neq 0$ state.

Figure 7A:
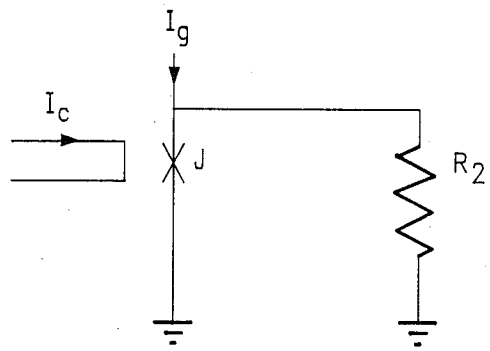
FIG. 7a shows an elementary diagram for a Josephson junction.
Figure 7B:
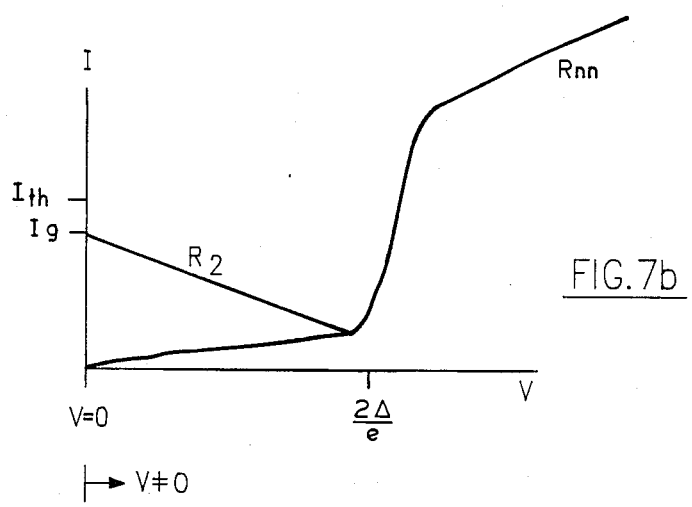
FIG. 7b shows a typical characteristic curve for a Josephson junction operated in a hysteristic mode.
Figure 7C:
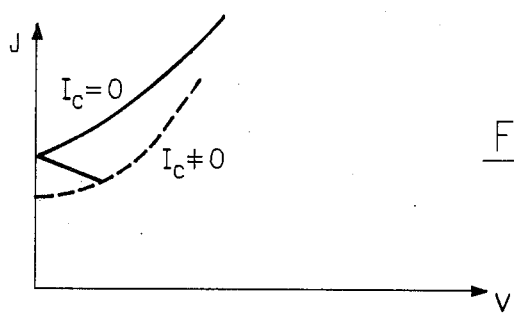
FIG. 7c shows a Josephson junction operated in a non-hysteristic mode.

The voltage/current characteristic and load line $R_L$ for a Josephson junction of FIG. 7a are shown in FIGS. 7b and 7c. A bias current $I_g$ is chosen below the threshold $I_{th}$ in order to account for system noise. Two modes are possible: the hysteristic mode when $\beta_c >> 1$ leading to the response shown in FIG. 7b and the non-hysteristic mode shown in FIG. 7c.

Equilibrium Response

Figure 8:
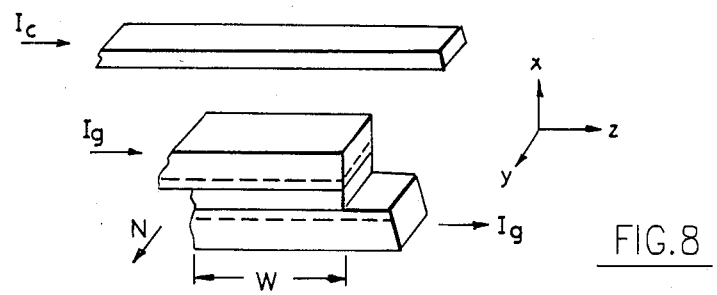
FIG. 8 shows a Josephson junction in perspective view.

The function $f(I_c)$ depends on the junction geometry and physical parameters of the superconducting films and the tunneling barrier of the Josephson junction. It describes the equilibrium response of the junction provided that $I_c$ does not cause any departure from equilibrium by breaking Cooper pairs. This requires that $(\delta\Delta/\delta I c)=0$ which means that $I_c$ does not contain components of frequencies $\geq 2\Delta$. If the junction is very small, for example, $w=1\mu m$ and $z=1\mu m$ (see FIG. 8), then $f(I_c)$ is given by:

$$f(I_c) = \frac{\sin(\pi I_c/I_{co})}{(I_c/I_{co})} \quad (2)$$

Figure 9:
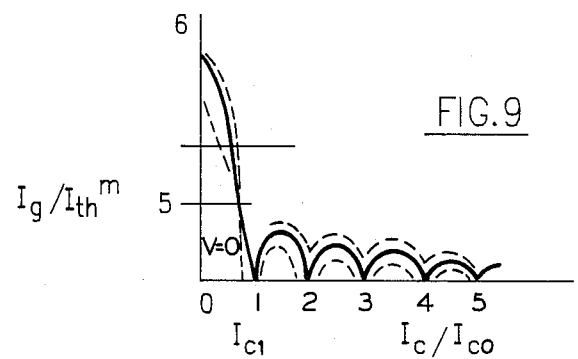
FIG. 9 is a graph of junction threshold current versus control current for a Josephson junction.

FIG. 9 is a graph of equation 2. In equation 2, $I_{co}=\Phi Z/\mu \; \Phi Z/\mu o dw; \; \Phi_o=h/Ze; \; d=\lambda 1+\lambda 2+l; \; \lambda 1, 2$ is the London penetration depth and $\lambda$ is the barrier thickness. for $d \cong 2000$ Å, then $I_{co}=8$ mA.

In the neighborhood of the operating point $(I_g, I_{cl})$, where $f(I_{cl})=0.5$, the function $f(I_c)$ is linear in $I_c$ as follows:

$$f(I_c)=\alpha(1-\beta I_c), \text{ with } \alpha=1.318 \text{ and } \beta=0.1287 \text{ (mA)}^{-1}. \quad (3)$$

Non-Equilibrium Response

In equation (1) $(\Delta/\Delta o)$ describes the nonequilibrium properties of the junction. An applied signal breaks Cooper pairs and creates an excess quasiparticle (qp) density $n=(N-N_t)/4N(o)\Delta o$, where N is the qp density generated by the applied signal, $N_t$ is the qp density thermally excited and $N(o)$ is the single spin density of states, with $N(o) \cong 2 \times 10^{22}(cm^3 ev)^{-1}$ for lead [Pb]. $N \neq 0$ leads to suppression of the gap according to FIG. 10 and the relation:

$$(\Delta/\Delta o)=1-2n. \quad (4)$$

(Parker, W. H. Phys. Rev. B12, 3667 (1975))

Figure 10:
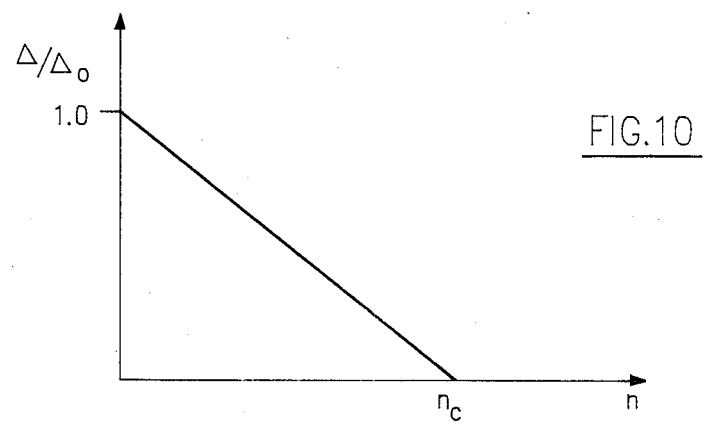
FIG. 10 shows a graph of equation (4) described more fully below.

A graph for equation (4) is shown in FIG. 10.

If $N/N_t >> 1$, which is the case at $T/T_c << 1$, and if $n \leq 0.05$, which suppresses the gap by 10%, then one can relate n to the incident power P(t) (from optical or X-ray sources) as follows:

$$n(t) \propto \sqrt{P(t)} \propto |\epsilon(t)| \quad (5)$$

Combining equation (5) with equation (4), the following is obtained:

$$(\Delta/\Delta o) \propto 1-\gamma\epsilon(t) \quad (6)$$

Using equations (3) and (6) in equation (1), the threshold current is given by $$I_{th}/I_o=\alpha(1-\gamma\epsilon(t))(1-\beta I_c) \quad (7)$$

Letting $I_c=I_{ci}+i$, where $i/I_c << 1$, then equation (7) becomes:

$$I_{th}/I_o=0.5-\alpha\beta i-0.5\gamma\epsilon(t)+\alpha\beta\gamma i\epsilon(t) \quad (8)$$

This equation reduces to the following, since the last term is negligible.

$$I_{th}/I_o=0.5-\alpha\beta i-0.5\gamma\epsilon(t) \quad (9)$$

This shows that this shows that the switching threshold is suppressed linearly by either a control current i, an optical field (t) or a combination thereof. The linear dependence allows the use of Josephson junctions to include measurement of optical signals. Since the junction is being biased so that switching takes place with $I_{th}/I_o=I_g/I_o=0.5$, it follows from equation (9) that:

$$i = \frac{-0.5\gamma}{\alpha\beta} |\epsilon(t)| \quad (10)$$

Thus, a control current i applied to ensure a constant switching threshold replicates the unknown optical field $\epsilon(t)$. Therefore, the control current $I_c$ shown in FIG. 2 provides a measure of the optical field intensity incident upon the Josephson junction.

Optical Power Requirement

The power necessary to generate $n=0.05$ is determined from the condensation energy as follows:

$$\epsilon(n) = \tfrac{1}{2}N(o)\Delta^2(n) = \tfrac{1}{2}N(o)\Delta_o^2(1-2n)^2 \cong \tfrac{1}{2}N(o)\Delta_o^2(1-4n) \quad (11)$$

$\delta\epsilon$ is the optical energy needed to create $n=0.05$ and is given by:

$$\delta\epsilon=\{\epsilon(o)-\epsilon(n)\}\Omega=2nN(o)\Delta_o^2\Omega \quad (12)$$

for $\Delta_o \cong 1.3$ meV, $N(o) \cong 2 \times 10^{22}(C-m^3 eV)^{-1}, \Omega=10^{-13} cm^3, \delta\epsilon=5.4 \times 10^{-18}$ J.

This is much larger than kT at 4.2 K. The optical power required at the junction in a time interval $R$ 10ns is $P=\delta\epsilon/\tau_R=540$ pW.

Accordingly, the above explanation shows that the use of Josephson junctions is extendible to the measurement of optical signals and that the power level necessary is less than 1 microwatt to achieve suppression of the gap by 10% and ensure linearity. Therefore, the Josephson junction will be sensitive to extremely small intensities of radiation.

HYPER SENSITIVE MODE OF OPERATION

The foregoing discussion covers a mode of operation involving the suppression of Josephson current, by means of gap suppression and the linear relationship between control currents and optical fields. There exists yet another mode of operation which does not involve the Josephson effect. It does, however, depend on non-equilibrium superconductivity and the superconducting quasi-particle tunneling leading to a hypersensitive mode of operation.

Figure 11:
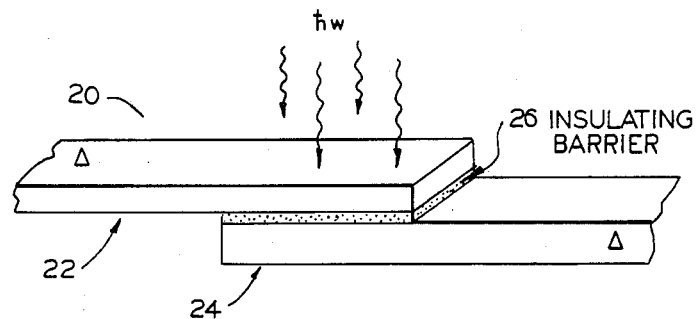
FIG. 11 shows a tunnel junction for a hypersensitive mode of operation.

The physical mechanism leading to hyper-sensitivity of superconducting sensors is explained with the aid of the figures. In FIG. 11 a tunnel junction 20 is shown made of thin superconducting electrodes 22, 24 and is irradiated with a photon energy, w. The electrodes are separated by an insulating barrier 26.

Figure 12:
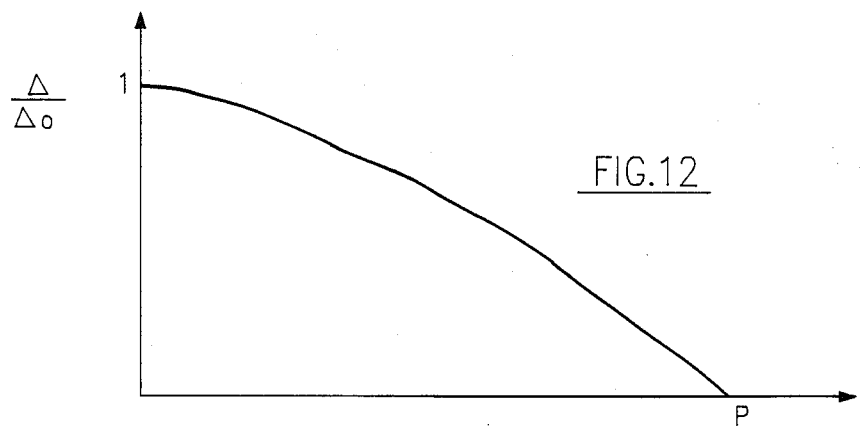
FIG. 12 shows the effects of gap suppression on the junction of FIG. 11.

Each superconducting film has an energy gap $\Delta$. This gap can be suppressed by means of breaking Cooper pairs in response to incident photons. Breaking Cooper pairs creates quasi-particles which tunnel through the barrier. FIG. 12 shows an illustration of how the gap is suppressed by means of incident photon power P.

Figure 13:
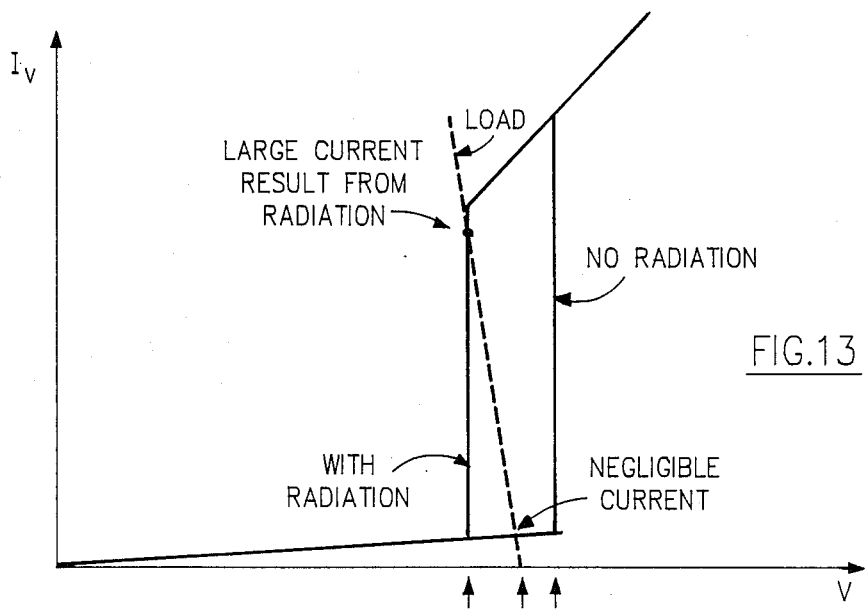
FIG. 13 shows a response characteristic curve for the the junction of FIG. 11.

The junction current-volt characteristics are shown in FIG. 13.

Figure 14B:
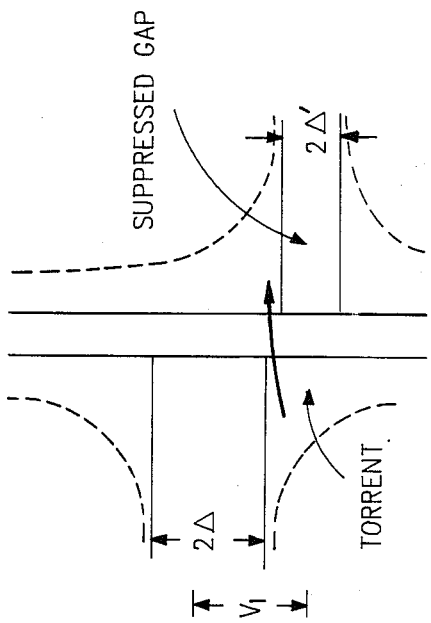
FIG. 14a and b show the energy levels across the junction of FIG. 11 with gap and without gap suppression respectively.
Figure 14A:
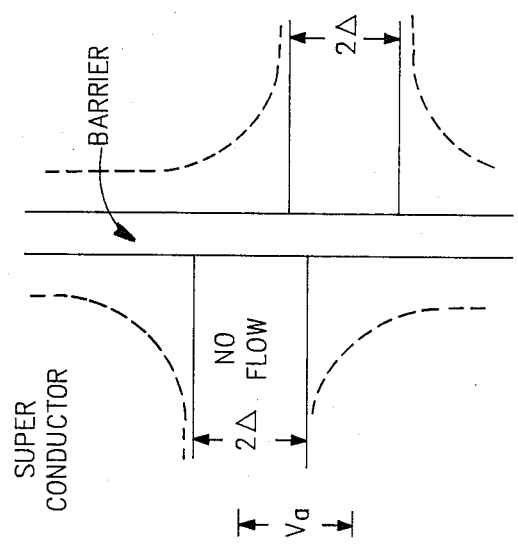

It is normally biased at a voltage $V_a$ just below the gap voltage, $V_g=2\Delta$. At this voltage, the current flowing through the device is negligibly small. This is explained by examining the energy diagram shown in FIGS. 14a and 14b. In FIG. 14a current cannot flow from the left-hand side to the right-hand side of the junction because the filled band coincides with the unallowed states in the band gap of the right-hand side.

By applying optical power to the junction, the gap is suppressed to a value $V_g<V_a$. When this condition is reached, the filled band on the left side of the junction now coincides with the completely empty band on the right creating a torrent of quasi-particles to flow (tunnel).

This mechanism is novel and cannot be exploited by conventional semi-conductor devices because their gaps cannot be altered in the same manner that the superconducting gaps can be altered. The torrent of current is aided, particularly, by means of the peak of the density of state at the band edges.

It is clear that keeping the same superconducting film thicknesses, while decreasing the barrier thickness, incrases exponentially the tunneling probability leading to current gain for the same incident photon energy. This is because the gap suppression is dependent only on the incident photon energy and not on the tunneling current density. The latter is a free parameter which can be used to optimize the device for hyper-sensitivity. Responsitivies in excess of 100,000 volt/watt have been demonstrated at wavelengths, ranging from 1-20 micrometers. It is anticipated that an additional order of magnitude improvement in responsivity will be obtained by increasing the current density further.

This hyper-sensitive mode of operation for optical detection is therefore an advantageous utilization of the properties of superconducting filsm and tunneling without needing to use the Josephson effect.

In accordance with another aspect of the present invention, Josephson junctions may be used to provide an image processing system comprising an array of such Josephson junctions. By providing such an array of junctions, it is possible to track variations in optical field amplitude via a feedback current controlling a junction. The same concept that is applied to an optical wavelength analyzer according to the invention also pertains to an image processing system.

An image processing system with a resolution of mxn pixels can be developed. This sytem comprises a linear array of m such elements all irradiated at one wavelength. Across the entire array, the optical field amplitude varies over distance in the X direction. Images of m pixels can be developed from the digitized and stored values of m feedback currents measuring this variation.

Figure 5:
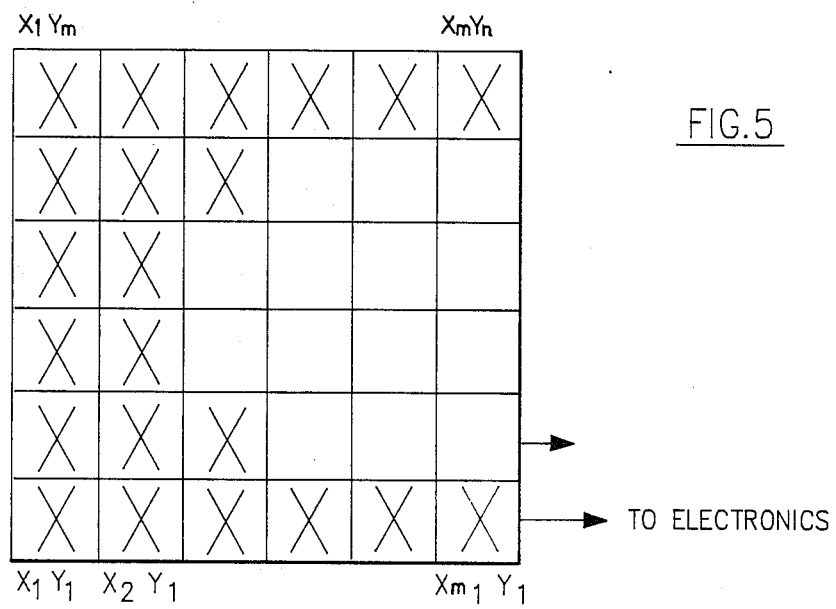
FIG. 5 shows an optical image processing array using parallel signal processing.
Figure 6:
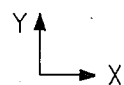
FIG. 6 shows an array for a serial optical image processing system.
Figure 6:
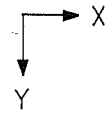

FIG. 5 and FIG. 6 illustrates two techniques for applying Josephson junctions to a two dimensional image processing system. FIG. 5 shows a parallel system, while FIG. 6 shows serial processing of the incident radiation.

With parallel processing, as shown in FIG. 5, a two dimensional fixed array of mxn Josephson junctions is arranged such that all elements are simultaneously excited by radiation of different intensities. Multiplexing techniques can be used to minimize the number of room temperature electronic circuits of FIG. 3 required, which in the case shown in FIG. 5 is mxn.

A less complex, linear arrangement as shown in FIG. 6 requires only m junctions as well as m sets of room temperature electronic circuits. In the case of FIG. 6, either the image could be moved across the device through mechanical control of the various optical elements or the linear device itself could be mechanically driven across the entire image. Multiplexing techniques can be used to minimize the number of room temperature electronic circuits in this application also, and would result in lower cost and complexity. The system responsivity, however, would also be lower.

As explained above, using the present invention, Josephson junctions designed for an image processing system can be responsive to a wide wavelength range—from visible (0.5 microns) to the far infrared region (100 microns).

To ensure maximum sensitivity to the image, various schemes can be employed which will enhance the signal to noise ratio for any measured radiation. Two alternatives may be employed. The array could be placed in a totally dark environment and measurements of background radiation stored. The background values could then be subtracted out from measurements made with the illuminated signal. The noise blanking could also be performed on line via a second linear array that measure the backgroun noise radiation. This would result in an enhanced signal to noise ratio leading to greater sensitivity.

In addition to the wide spectral range and sensitivity, another advantage of the present invention is that the gap of superconductors does not change over time. Therefore, there will not be any aging problem, unlike semiconductors where the tailor made gaps are susceptibe to change for extremely long wavelengths.

As demonstrated above, the optical power required to switch a single junction in 10ns is approximately 540 pW. The responsivity of a junction biased at 1 ma switching to a gap of 3mV is $5.5\times 10^6$ V/W. This extreme sensitivity is the direct combination of Josephson junction switching properties with nonequilibrium properties, unlike other schemes wherein the gap is suppressed to zero without utilizing the Josephson effect.

As shown in FIG. 3, an additional feature afforded by the feedback electronic circuitry of the present invention is the averaging out of noise leading to the realization of high responsivity. To achieve even higher responsivity, it is possible to use different superconductors with different insulating layers to deliberately lengthen the effect of carrier lifetime. In particular, barium-lead-bismuth superconductors may be employed.

Accordingly, the present invention provides an optical spectrum analyzer and an optical imaging system which is sensitive to minute intensities of optical radiation. The system operates at low temperatures, is relatively immune to noise and, furthermore, is responsive to radiation over a wide range, from infrared to X-ray.

As equation (9) shows, the optical field intensity is related to the control current in a linear fashion. As this equation shows, there are essentially two schemes for mapping the field intensity as a function of the control current. The threshold may be kept constant by biasing the Josephson junction so as to keep the threshold constant, i.e., by properly applying a control signal $I_c$ to the Josephson junction such that a constant switching threshold $I_{th}$ is maintained, the current $I_c$ will track the field intensity. Alternatively, the bias current can be kept constant, in which case the switching threshold will change, and the switching threshold can be used as the variable mapping the field intensity.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. Apparatus for measuring the intensity of incident optical radiation comprising:
   Josephson junction means for receiving incident optical radiation at a junction thereof, said Josephson junction means being operable in a first state wherein a voltage across the junction is substantially zero and a second state wherein said voltage across said junction is substantially non zero and being responsive to a bias current to enable said Josephson junction means to switch between said first and said second states at a predetermined frequency; and
   electronic circuit means coupled to receive a signal from said Josephson junction means for supplying a control signal to said Josephson junction means to maintain the switching of said Josephson junction means between said first and said second states at said predetermined frequency said control signal being proportional to the intensify of said incident optical radiation.

2. The apparatus recited in claim 1, wherein said electronic circuit means comprises:
   means for amplifying, coupled to said Josephson junction means;
   means for low pass filtering, coupled to an output of said means for amplifying; and
   comparator means, having a first input coupled to an output of said means for low pass filtering and a second input coupled to a reference voltage, for producing said control signal.

3. The apparatus recited in claim 1, further comprising:
   optical means for dispersing said optical radiation into a plurality of wavelengths;
   a plurality of said Josephson junction means for receiving said plurality of wavelengths, each of said plurality of Josephson junction means being arranged to receive a different one of said plurality of wavelengths; and
   a plurality of said electronic circuit means for supplying each of said plurality of Josephson junction means with a respective control signal.

4. The apparatus in claim 1, further comprising:
   optical means for dispersing said optical radiation into a plurality of wavelengths, and
   means for moving said Josephson junction means relative to said optical means so that said Josephson junction means sequentially receives said optical radiation at each of said plurality of wavelengths.

5. The apparatus recited in claim 1, further comprising:
   a plurality of said Josephson junction means arranged in a two dimensional array, said two dimensional array comprising an optical sensor for an optical imaging system, and
   a plurality of said electronic circuit means supplying each of said plurality of Josephson junction means with a respective control signal.

6. The apparatus recited in claim 1, further comprising:
   a plurality of said Josephson junction means arranged in a linear array;
   means for moving said linear array with respect to an image to be sensed; and
   a plurality of said electronic circuit means supplying each of said plurality of Josephson junction means with a respective control signal.

7. An optical wavelength analyzer for measuring the intensity of incident optical radiation comprising:
   Josephson junction means for receiving incident optical radiation at a junction thereof, said Josephson junction means being operable in a first state wherein a voltage across the junction is substantially zero and a second state wherein said voltage across said junction is substantially non-zero and being responsive to a bias current to enable said Josephson junction means to switch between said first and said second states at a predetermined frequency; and
   electronic circuit means coupled to receive a signal from said Josephson juncton means for supplying a control signal to said Josephson junction means between said first and said second states at said predetermined frequency said control signal being proportional to the intensity of said incident optical radiation.

8. The apparatus recited in claim 7, wherein said electronic circuit means comprises:
   means for amplifying, coupled to said Josephson juncton means;
   means for low pass filtering, coupled to an output of said means for amplifying; and
   comparator means, having a first input coupled to an output of said means for low pass filtering and a second input coupled to a reference voltage, for producing said control signal.

9. The apparatus recited in claim 7, further comprising:
   optical means for dispersing said optical radiation into a plurality of wavelength;
   a plurality of said Josephson junction means for receiving said plurality of wavelengths, each of said plurality of Josephson junction means being arranged to receive a different one of said plurality of optical wavelengths, and
   a plurality of said electronic circuit means for supplying each of said plurality of Josephson junction means with a respective control signal.

10. The apparatus recited in claim 7, further comprising:
    optical means for dispersing said optical radiation into a plurality of wavelengths, and
    means for moving said Josephson junction means relative to said optical means so that said Josephson junction means sequentially receives said optical radiation at each of said wavelengths.

11. An image processing system for detecting an image from incident optical radiation, comprising:

Joseph junction means for receiving incident optical radiation at a junction thereof, said Josephson junction means being operable in a first state wherein a voltage across the junction is substantially zero and a second state wherein said voltage across said junction is substantially non zero and being responsive to a bias current to enable said Josephson junction means to switch between said first and second states at a predetermined frequency; and electronic circuit means coupled to receive a signal from said Josephson junction means for supplying a control signal to said Josephson junction means to maintain the switching of said Josephson junction means between said first and said second states at said predetermined frequency said control signal being proportional to the intensity of said incident optical radiation.

12. The system recited in claim 11, wherein said electronic circuit means comprises:

means for amplifying, coupled to said Josephson junction means;

means for low pass filtering, coupled to an output of said means for amplifying; and comparator means, having a first input coupled to an output of said means for low pass filtering and a second input coupled to a reference voltage, for producing said control signal.

13. The system recited in claim 11, further comprising:

optical means for dispersing said optical radiation into a plurality of wavelengths;

a plurality of said Josephson junction means for receiving said plurality of wavelengths, each of said plurality of Josephson junction means being arranged to receive a different one of said plurality of optical wavelengths; and a plurality of said electronic circuit means for supplying each of said plurality of Josephson junction means with a respective control signal.

14. The system recited in claim 11, further comprising:

optical means for dispersing said optical radiation into a plurality of wavelengths, and means for moving said Josephson junction means relative to said optical means so that said Josephson junction means sequentially receives said optical radiation at each of said wavelengths.

15. A sensor of optical radiation comprising:

means for receiving optical radiation;

means for flowing an electric current only when the power of said optical radiation is sufficient to cause a threshold voltage to be exceeded, said means for flowing an electric current comprising, a tunnel junction having a gap voltage associated therewith, said gap voltage being suppressed in accordance with the power of said optical radiation;

means for biasing said means for flowing an electric current to a voltage just below said gap voltage thereby setting said threshold voltage.

16. The sensor of claim 15 wherein said tunnel junction comprises:

first superconducting film having a first energy gap associated therewith;

second superconducting film having a second energy gap association therewith; and insulating barrier disposed between said first superconducting film and said second superconducting film.

* * * * *

UNITED STATES PATENT AND TRADEMARK OFFICE
CERTIFICATE OF CORRECTION

PATENT NO. : 4,814,598

DATED : March 21, 1989

INVENTOR(S) : Faris, Sadeg M.

It is certified that error appears in the above-identified patent and that said Letters Patent is hereby corrected as shown below:

Column 1, line 23, "-L335" should read --L335--.

Column 2, line 24, "just" should read --first--.

Column 2, lines 67 and 68, "the the" should read --the--.

Column 4, line 8, "and and" should read --and--.

Column 5, line 17, "$2\Delta$ If" should read --$2\Delta$. If--.

Column 5, line 34, "1287" should read --1287--.

Column 6, line 18, "with" should read --when--.

Column 6, line 41, "1.3    meV," should read --1.3 meV,--.

Column 7, line 1, ",    w." should read --, $\hbar$w.--.

Column 7, lines 38 and 39, "Responsitivies" should read --Responsivities--.

Column 7, line 46, "filsm" should read --films--.

Column 8, line 32, "measure" should read --measures--.

Column 8, line 33, "backgroun" should read --background--.

Column 9, line 38, "intensify" should read --intensity--.

UNITED STATES PATENT AND TRADEMARK OFFICE
CERTIFICATE OF CORRECTION

PATENT NO. : 4,814,598

DATED : March 21, 1989

INVENTOR(S) : Faris, Sadeg M.

It is certified that error appears in the above-identified patent and that said Letters Patent is hereby corrected as shown below:

Column 6, line 13, delete (2 occurrence) --this shows that--.

Column 10, line 52, "wavelength;" should read --wavelengths;--.

Signed and Sealed this

Twenty-second Day of May, 1990

Attest:

HARRY F. MANBECK, JR.

Attesting Officer

Commissioner of Patents and Trademarks